United States Patent [19]

Seno et al.

[11] Patent Number: 5,230,920
[45] Date of Patent: Jul. 27, 1993

[54] METHOD OF COATING SENSITIZING SOLUTION ON METAL PLATE FOR USE IN MANUFACTURE OF COLOR CATHODE RAY TUBE AND COATING APPARATUS

[75] Inventors: Mitsuru Seno, Yokohama; Nobuo Kita, Himeji; Takayuki Matsumoto, Hyogo; Seiji Sago, Fukaya, all of Japan

[73] Assignee: Kabushiki Kaisha Toshiba, Kawasaki, Japan

[21] Appl. No.: 779,736

[22] Filed: Oct. 23, 1991

[30] Foreign Application Priority Data

Oct. 23, 1990 [JP] Japan ................. 2-284968

[51] Int. Cl.⁵ .......... B05D 5/06; B05D 1/28; B05C 1/00
[52] U.S. Cl. ........................ 427/64; 118/244; 118/258; 118/259; 118/261; 427/428; 430/23
[58] Field of Search ......... 427/428; 118/258, 244, 118/259, 261, 64; 430/23

[56] References Cited

U.S. PATENT DOCUMENTS

| | | | |
|---|---|---|---|
| 3,947,609 | 3/1976 | Warner et al. | 430/23 |
| 4,345,543 | 8/1982 | Pipkin | 118/413 |
| 4,400,953 | 8/1983 | Driessen et al. | 118/261 |
| 4,442,144 | 4/1984 | Pipkin | 118/413 |
| 4,548,840 | 10/1985 | States et al. | 118/259 |
| 5,006,432 | 4/1991 | Sagou | 430/23 |

FOREIGN PATENT DOCUMENTS

| | | |
|---|---|---|
| 0314110 | 5/1989 | European Pat. Off. |
| 2237556 | 2/1973 | Fed. Rep. of Germany |
| 54-123151 | 9/1979 | Japan |
| 58-6533 | 2/1983 | Japan |

Primary Examiner—Janyce Bell
Attorney, Agent, or Firm—Cushman, Darby & Cushman

[57] ABSTRACT

A coating apparatus for coating a sensitizing solution onto a surface of an elongated metal plate includes a transfer roller and a coating nozzle for coating the sensitizing solution on a circumferential surface of the roller. The circumferential surface of the transfer roller is in contact with the surface of the metal plate running in the longitudinal direction under a predetermined tension. The transfer roller is rotated in a direction opposite to that in which the metal plate is run, so that the coated sensitizing solution is transferred from the circumferential surface of the transfer roller on the surface of the metal plate.

7 Claims, 3 Drawing Sheets

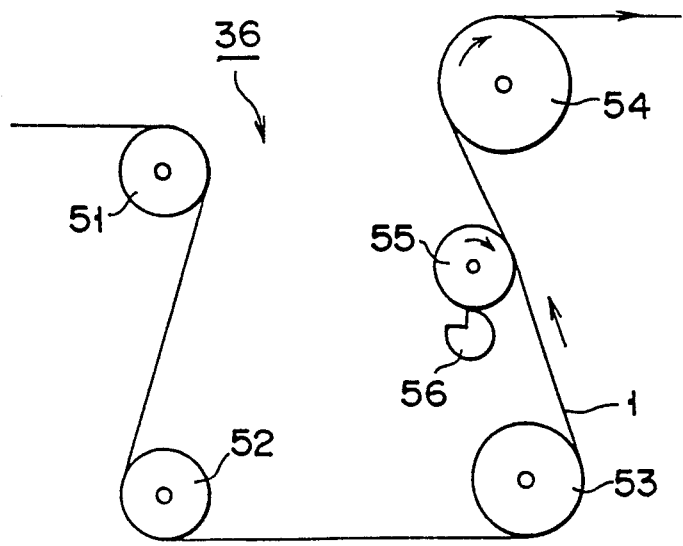
F I G. 2
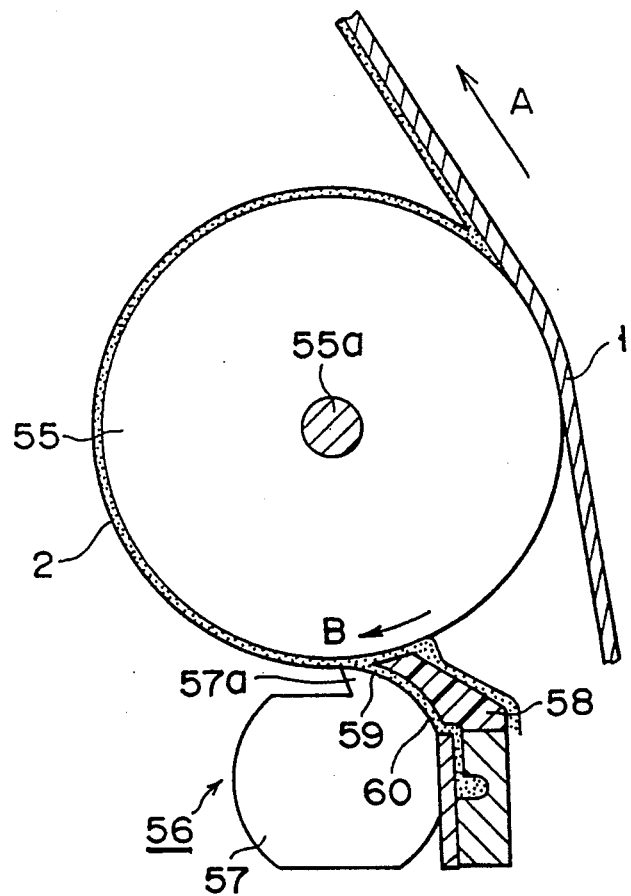
F I G. 3

METHOD OF COATING SENSITIZING SOLUTION ON METAL PLATE FOR USE IN MANUFACTURE OF COLOR CATHODE RAY TUBE AND COATING APPARATUS

BACKGROUND OF THE INVENTION

1. Field of the Invention

The present invention relates to a method of coating a sensitizing solution onto a metal plate used for manufacturing shadow masks for color cathode ray tubes, and a coating apparatus.

2. Description of the Related Art

Conventionally, a coating apparatus has been known which coats a sensitizing solution onto a metal plate for a shadow mask in the process of manufacturing that shadow mask for color cathode ray tubes. The coating apparatus comprises, in a sequential order, a supply machine having a roll of elongated metal sheet, i.e., iron sheet, for drawing the sheet from the roll, seam welder, back tension device for imparting a back tension to the running iron sheet, washing tank, drying furnace, coating machine, drying furnace, drive device for running the iron sheet, and winding machine for winding-up the iron sheet. The seam welder is used to seam the ends of iron sheets in the case where, when one iron sheet is exhausted on the supply machine, another iron sheet is fed out of another supply machine.

The coating machine includes a top-opened vessel for storing a sensitizing solution. In the bottom wall of the vessel is formed a slit through which the iron sheet passes from the underside of the vessel to the upper-side thereof. Wipers are provided around the slit and slidably and intimately contact with the iron sheet in a liquid-tight fashion, preventing the solution from leaking downward through the slit.

The sensitizing solution coating process using the conventional apparatus will be explained below.

The iron sheet drawn from the supply machine passes through the lower portion of the seam welder and the back tension device to the washing tank where dust and smudges are washed away from the surfaces of the iron sheet. Then the sheet, after drying up by the drying furnace, is run vertically past the coating machine.

Upon the passage of the iron sheet through the coating machine, it enters the vessel, via the slit, from below and is moved in the sensitizing solution in the vessel and lifted up from the top-opened end of the vessel with the solution coated on the whole surfaces of the iron sheet.

The solution-coated iron sheet passes through the drying furnace where the solution dries up by heat on the surfaces of the iron sheet with water evaporated, thus forming resist layers on the surfaces of the iron sheet. The resultant iron sheet is run past the iron sheet drive device to the winding machine where it is wound thereon.

The thickness of the resist layer in the dried state is determined depending upon the concentration and viscosity of the solution stored in the vessel, lift-up speed of the iron sheet being run through the vessel, and heating energy in the drying furnace. That is, the enhanced concentration and viscosity of the sensitizing solution, increased lift-up speed of the iron sheet and increased heating energy at the drying furnace result in an increase in the thickness of the resist layer.

If the concentration of the solution is enhanced so as to increase the thickness of the resist layer, the viscosity of the solution is also increased. However, too high a viscosity results in generating air bubbles in the sensitizing solution and hence in a greater variation in the thickness of the resist layer Further, if the lift-up speed of the iron sheet is increased, the coated iron sheet does not sufficiently dry up unless the length of the drying furnace is increased. If the heating energy at the drying furnace is too great, only the surface region of the coated layer on the iron sheet quickly dries up and becomes heavier, but that region of the coated layer which is close to the surface of the iron sheet remains moist, causing a drip or run of the coated solution. Thus, the thickness of the coated layer becomes unstable This is partly because the coated iron sheet is dried by the drying furnace in a vertical state. The iron sheet vertically lifted up from within the coating machine has all surfaces thereof coated with the solution and, therefore, has to dry up in the vertical state.

In this way, the conventional method includes a very unstable coating step.

As set out above, since the concentration and viscosity of the sensitizing solution cannot be made too high and the iron sheet has its whole surfaces pass through the solution, the resist layer thus formed is made thicker at each side edge portion called "fat edge" portion. That is, with $t1$ representing the thickness of the resist layer at a central area on one surface of the iron sheet; $t2$, the thickness of the end edge portions; and $t3$, the thickness of the resist layer at a central area on the other surface of the iron sheet, $t1=t3$ but, at $t2=a \times t1$, $a=$ about 1.3 to 1.4.

The "fat edge" phenomenon is not desirable because the iron sheet is irregularly wound up on rollers, etc., at the subsequent step or steps. This is due to the fact that, upon being wound around a winding cylinder, the iron sheet suffers a load only at its side edges and hence has its central area create a gap between its adjacent turns of the iron sheet coil on the cylinder Further, the entire iron sheet passes through the sensitizing solution and is coated with the solution also at each side edge. The solution deposited on the respective side edge of the iron sheet is originally required, but, once being dried, the dried portion is liable to be peeled from the dried surface of the iron sheet, sometimes causing a fall of dust in the subsequent step or steps. In a later exposure step in particular, an original sensitizing plate is soiled by such dust and hence the deposition of the solution on each side edge of the iron sheet should initially be avoided.

The iron sheet having the resultant resist layer is transferred to an etching step through an exposure step. In the etching step following the exposure step, the iron sheet is etched after an etching solution is sprayed on each resist layer, whereby electron beam passage holes are formed at those positions corresponding to those unexposed resist layer portions of the iron sheet. By so doing, larger holes are provided in one surface side and corresponding smaller holes are provided in the other surface side of the iron sheet to provide communication between each larger hole and the corresponding smaller hole.

In the recent etching step, in order to reduce the etching time, a higher spray pressure has been employed upon the spraying or jetting of the etching solution on the resist layer. This tendency is prominent when the larger holes in particular are formed in the iron sheet. However, the use of too high a spray pressure produces a defect in the resist layer, failing to open electron beam passage holes, as designed, in the iron sheet. This problem can be solved by making the resist layer on the larger hole side thicker than that on the smaller hole side of the iron sheet. In the conventional coating method as set out above, however, it is not possible to vary the coating layer thickness at both surface sides of the iron sheet, that is, the same layer thickness is formed at each surface side of the iron sheet. Further, it is not possible to form a considerably thick resist layer on the iron sheet surface because the sensitizing solution is not made higher in concentration and viscosity.

SUMMARY OF THE INVENTION

It is accordingly the object of the present invention to provide a coating method and a coating apparatus which are capable of uniformly coating a sensitizing solution on each surface side of a metal plate throughout and freely setting that coating thickness of the metal plate on its respective surface side.

In order to achieve the aforementioned object of the present invention, there is provided a method of coating a sensitizing solution on an elongated metal plate for use in the manufacture of a shadow mask for color cathode ray tubes, comprising the steps of: running the metal plate under predetermined tension in a longitudinal direction of the metal plate; bringing one of surfaces of the running metal plate into contact with a circumferential surface of a transfer roller which is rotated in a direction opposite to that in which the metal plate is run; coating a sensitizing solution on the circumferential surface of the transfer roller with a predetermined thickness; and continuously transfer-coating the coated sensitizing solution from the transfer roller onto the one surface of the metal plate.

According to the present invention, there is provided a coating apparatus comprising means for running an elongated metal plate under predetermined tension in the longitudinal direction of the iron sheet; a transfer roller having a circumferential surface in contact with one of the surfaces of the metal plate; means for coating a sensitizing solution on the circumferential surface of the transfer roller with a predetermined thickness; and means for rotating the transfer roller in a direction opposite to that in which the metal plate is run, so as to continuously transfer the coated sensitizing solution from the transfer roller to the one surface of the metal plate.

According to the present method and apparatus, the sensitizing solution is once coated on the transfer roller with a uniform thickness and the coated solution is continuously transfer-coated to the running metal plate under a predetermined tension, enabling it to be uniformly coated on the whole surface of the metal plate without a coating defect. Further, the coating of the solution is made on one surface of the plate at a time and it is, therefore, possible to coat the solution separately on each surface of the metal plate and to freely set a thickness with which the solution is coated on each surface of the metal plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 to 5 show a coating apparatus according to an embodiment of the present invention, in which FIG. 1 is a view schematically showing the whole apparatus, FIG. 2 is an enlarged view showing a coating machine the apparatus shown in FIG. 1, FIG. 3 is an enlarged view showing a transfer roller and a nozzle section for coating a sensitizing solution onto the transfer roller, FIG. 4 is a perspective view showing the transfer roller and the around thereof, and FIG. 5 is an explanative view showing a flow of the sensitizing solution along the surface of a running iron sheet.

DETAILED DESCRIPTION OF THE PREFERRED EMBODIMENTS

An embodiment of the present invention will be explained in detail with reference to the accompanying drawings.

Figure 1:
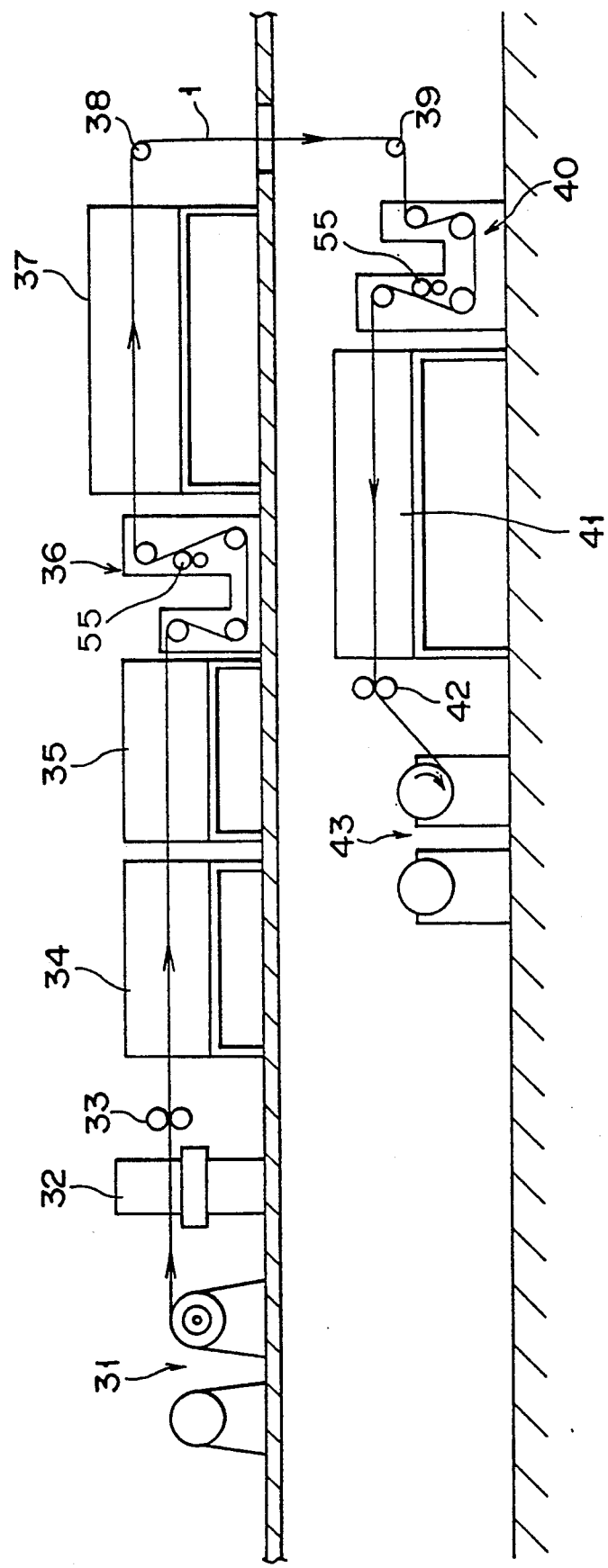

FIG. 1 is a view schematically showing a coating apparatus for coating a sensitizing solution 2 (see FIG. 3) on an elongated metal plate, e.g., an iron sheet 1 during a process of manufacturing a shadow mask of color cathode ray tubes.

The coating apparatus comprises a supply machine 31 having a roll of the iron sheet, for drawing the sheet from the roll, seam welder 32, back tension device 33 for imparting tension to the iron sheet, washing tank 34, first drying furnace 35, first coating machine 36 for coating a sensitizing solution on the front surface of the iron sheet 1, second drying furnace 37 and turn roller 38, noting that these components from the supply machine 31 to the turn roller 38 are arranged, for example, on the upper floor of a factory. Further, the coating apparatus comprises a turn roller 39, second coating machine 40 for coating the sensitizing solution to the rear surface of the iron sheet 1, third drying furnace 41, iron sheet drive device 42 for running the iron sheet 1 through the aforementioned components in a direction indicated by arrows in FIG. 1, and winding machine 43 for winding the iron sheet 43. The components from the turn roller 38 to the winding machine 43 are arranged on a ground floor. Here, except the coating machines 36, 40 and drying furnaces 37, 41, the other units are the same as those used in the conventional apparatus. In the conventional apparatus, the solution-coated iron sheet passes through the drying furnace in a vertical direction while, according to the embodiment of the present invention, the solution-coated iron sheet passes through the drying furnaces in a horizontal state. Herein lies a difference between the two apparatuses.

Figure 4:
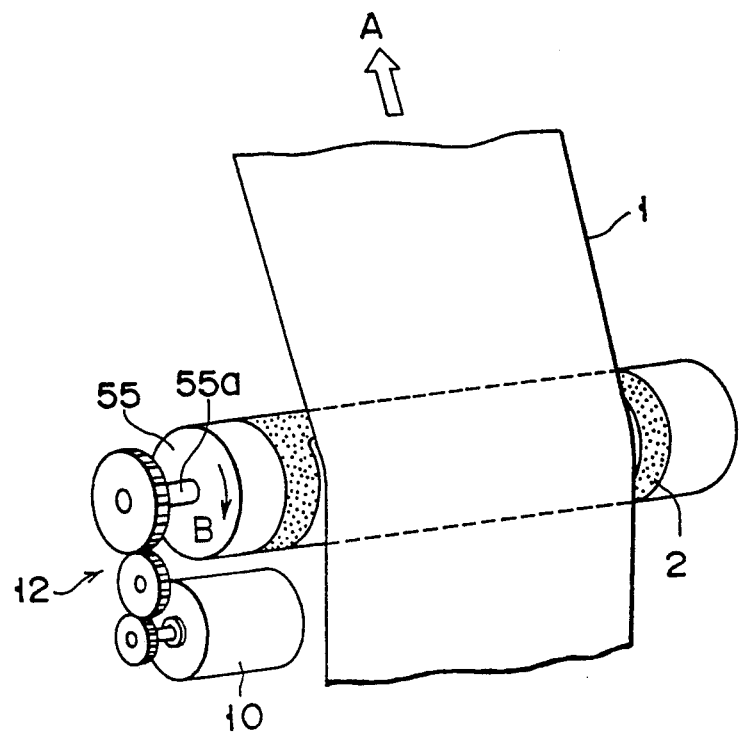

FIGS. 2 to 4 show a detail of the first coating machine 36. The first, or the front surface side, coating machine 36 has the same arrangement as that of the second, or the rear surface side, coating machine 40, except that a transfer roller 55 is made in contact with a different surface of the iron sheet 1. Thus, a full explanation will be given about the first coating machine only.

As shown in FIGS. 2 to 4, the coating machine 36 includes two turn rollers 51, 52 and first and second tension rollers 53, 54. The iron sheet 1 running in a direction of an arrow A is wound about the rollers 51, 52, 53 and 54 such that predetermined tension is applied to the iron sheet. A transfer roller 55 is provided between the first and second tension rollers 53 and 54. At an intermediate position between the rollers 53 and 54, the transfer roller 55 has its peripheral surface slidably in pressure contact with the front surface of the iron sheet 1. The transfer roller 55 is driven by a drive motor 10 through a gear train 12 such that it is relatively rotated at a predetermined speed in a direction B opposite to that in which the iron sheet 1 is run. The rollers 51, 52, 53, 54 and 55 are all disposed parallel to one another. The transfer roller 55 has a rotation shaft 55a extending parallel with the surfaces of the iron sheet 1 and in a direction perpendicular to the direction A of the run of the iron sheet. The transfer roller 55 is made longer than the width of the iron sheet 1, and the circumferential surfaces of both ends of the roller 55 project from each side edge of the iron sheet 1, respectively.

A linear, sensitizing solution coating nozzle 56 is arranged below the transfer roller 55 and extends parallel with, and opposite to, the transfer roller 55. As shown in FIG. 3, the solution coating nozzle 56 has a body 57 extending parallel with the transfer roller 55, and a resin dam 58 provided on the rear side of the body and extending in a direction parallel with the roller 55. The body is formed in a columnar shape having a notch extending in the axis thereof. The body 57 is provided at it upper end with a knife edge 57a. The knife edge 57a and an upper end surface of the dam 58 are opposite to the circumferential surface of the transfer roller in a parallel relation with a predetermined gap. An outlet 59 for the sensitizing solution is opened at a location between the knife edge 57a and the upper end surface of the resin dam 58 and connected to a sensitizing solution supply source, not shown, through a passage 60 defined between the body 57 and the dam. The outlet 59 is directed in the direction B in which the transfer roller 55 is rotated.

The process of coating the sensitizing solution on the iron sheet 1 with the use of the coating apparatus thus constructed will be explained.

As shown in FIG. 1, when the drive device 42 is driven, the iron sheet 1 is fed out of the supply machine 31 and conveyed past the lower portion of the seam welder 32 and then past the back-tension device 33 to the washing tank 34 where dust and smudges are washed from the surfaces of the iron sheet 1. Then the iron sheet 1 is conveyed to the drying furnace 35 to allow it to dry up, and conveyed past the first coating machine 36 where one surface, for example, the front surface, of the iron sheet 1 is coated with the sensitizing solution 2, the detail of which will be set forth below. The coated iron sheet 1 is conveyed through the drying furnace 37 in a horizontal state. Then the iron sheet is guided downward by the turn roller 38 to the turn roller 39, that is, guided from the upper floor down to the ground floor, with its front surface inverted. Then it is conveyed into the second coating machine 40 where the inverted side, that is, the rear surface, of the iron sheet 1 is coated with the sensitizing solution 2. The coated iron sheet 1, after being dried in a horizontal state in the drying furnace 41, is run past the iron sheet drive device 42 to the winding machine 43 where it is wound up.

The coating of the sensitizing solution 2 on the sheet by the coating machines 36, 40 will be explained below in more detail.

As shown in FIG. 3, the sensitizing solution 2 discharged from the outlet 59 of the coating nozzle 56 is coated onto the circumferential surface of the transfer roller 55 which is rotating in the direction B at a predetermined speed. At this time, the sensitizing solution 2 is coated on the transfer roller 55 with a thickness corresponding to the gap between the knife edge 57a of the nozzle 56 and the circumferential surface of the transfer roller 55, allowing a solution layer of uniform thickness to be coated on the circumferential surface the transfer roller 55. The thickness of the coated solution can freely be set by adjusting the distance of the knife edge 57a relative to the circumferential surface of the transfer roller 55.

As shown in FIGS. 2 and 3, in the coating machine 46, 40, the iron sheet 1 is given predetermined tension by the action of the back tension device 33 and first and second tension rollers 53, 54 and, in that state, moved past these tension rollers 53, 54. At the intermediate location between the rollers 53 and 54, the iron sheet has one surface pressed in contact with the circumferential surface of the transfer roller 55. As shown in FIGS. 3 and 4, with the roller 55 being rotated in the direction B opposite to the direction A in which the iron sheet 1 is run, the solution 2, once being coated on the transfer roller 55 as described above, is continuously transferred and coated on one surface of the sheet while being moved in the direction B prior to an area of contact between the roller 55 and the iron sheet 1. Then the sheet 1 is wrapped around the tension roller 54 while its surface, opposite to that solution-coated surface, is in contact with the tension roller 54 and is conveyed to the drying furnace 37 after it has been changed in its running direction.

As already set out above, the thickness of the solution to be coated on the transfer roller 55 is set by the knife edge 57a, that is, determined by the gap between the roller 55 and the knife edge 57a of the solution coating nozzle 56. Any excess portion of the solution 2 is flowed past the resin dam 58 and overflowed backward, that is, in the direction opposite to the direction B in which the transfer roller 55 is rotated. Therefore, even if an amount of sensitizing solution 2 supplied to the coating nozzle 56 varies, it does not adversely affect the thickness of the solution 2 to be coated onto the transfer roller 55.

Further, the transfer roller 55 and coating nozzle 56 can be accurately manufactured by a machine work as finished products, reducing a variation in the thickness of the solution layer, to be transferred to the sheet, to a lesser extent.

Figure 5:
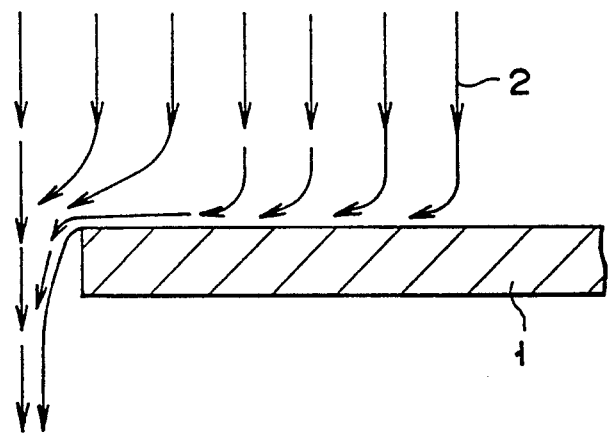

FIG. 5 shows a flow of the solution 2 upon being transferred from the transfer roller 55 to the iron sheet 1. As shown in FIG. 5, at each side edge portion of the iron sheet 1, in particular, the solution 2 which has flown in the direction B of the rotation of the transfer roller 55, is run along the iron sheet 1 in the axial direction of the roller 55 as it approaches the iron sheet 1 and, beyond each side edge of the iron sheet 1, and flows again in the direction B along with the rotation of the roller 55. Since such a flow of the sensitizing solution 2 can be created at each surface side of the iron sheet, the solution is hard to deposit on the side end face of the iron sheet and, at the same time, it does not intrude onto that surface of the iron sheet 1 which is opposite to the surface being coated with the solution 2.

Figure 6:
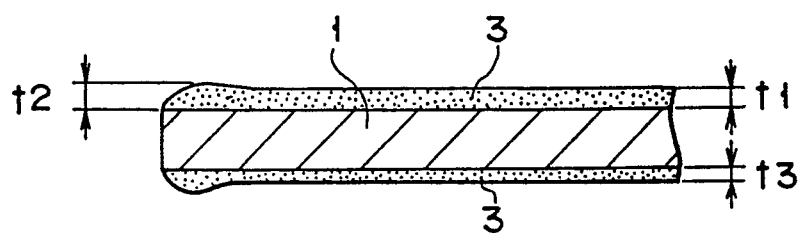
FIG. 6 is a cross-sectional view of the iron sheet with resist layer formed on each surface of the sheet.

FIG. 6 is a cross-sectional view showing the thickness of resist layers 3 formed by drying the coated solution on the iron sheet 1, that is, the cross-sectional view taken in the direction perpendicular to the direction A in which the iron sheet 1 is run. In FIG. 6, if t2=a×t1 where t1: the thickness of the resist layer 3 at a central area on one surface of the iron sheet 1; t2: the thickness of the side edge portions of the iron sheet 1; and t3: the thickness of the resist layer 3 at the central area on the other surface of the iron sheet 1, then a becomes about 1.1 to 1.15. That is, the flow of the sensitizing solution 2 as shown in FIG. 5 enables the value a to largely approach 1 compared with a conventional one. This ensures the formation of a resist layer with a substantially uniform thickness throughout the whole iron sheet surface.

Thus, the thickness of the resist layer 3 can be made uniform across the whole width of the iron sheet 1, preventing the iron sheet 1 from being wound in an irregularly shifted relation, at the subsequent step or steps. Further, since the sensitizing solution 2 is transferred to the iron sheet 1 after being coated once on the transfer roller 55, the solution can be coated under a better condition even if the concentration and viscosity of the solution is made higher than those of the conventional one. By using a sensitizing solution of higher concentration and viscosity, it is possible to reduce the formation of a raised portion of the coated solution at each side edge portion of the iron sheet, resulting from the surface tension of the solution. It is thus possible to form a resist layer of more uniform thickness.

The coating of the sensitizing solution onto each surface of the iron sheet 1 is effected one side at a time with the use of the first coating machine 36 for the front surface and the second coating machine 40 for the rear surface of the iron sheet. It is, therefore, possible to freely vary the thickness of the resist layer 3 on each of the surfaces of the iron sheet 1. That is, it is possible to make the thickness of the resist layer 3 on the front surface of the iron sheet to be different from that the resist layer on the rear surface of the iron sheet. This enhances the freedom with which a flat shadow mask is designed. The iron sheet 1 can be so set that, for example, the resist layer 3 is thickened on that surface side where larger holes are formed as electron beam passage holes and is thinned on that surface side of the iron sheet where smaller holes are formed as corresponding holes.

A defect, such as variation in the thickness of the resist layer is not involved by coating the solution 2 on the iron sheet 1 by the transfer roller 55, not directly by the coating nozzle 56. Further, it is possible to make the concentration and viscosity of the sensitizing solution 2 higher than those of the conventional one, requiring less energy for drying by the drying furnaces 37, 41.

Since the iron sheet 1 is dried in the horizontal state after being coated with the solution, the solution does not drop, during drying, even if a thicker solution layer is coated on the iron sheet. As a result, the thickness of the resist layer 3 can be made about two times as thick as that of the conventional one.

The formation of the ticker layer involves no lack or peel of the resist layer even under a higher spraying pressure of the etching solution at the etching step. Due to the flow of the solution 2 as shown in FIG. 5, the solution 2 deposited on each side end surface of the iron sheet 1 can be more prominently saved than that on the conventional apparatus as shown in FIG. 6, resulting in the generation of less dust which would otherwise be unattainable due to the separation of the dried portion of the deposited solution from the iron sheet at the subsequent steps. It is thus possible to suppress the soiling of an original sensitizing plate at an exposure step.

As describe above in detail, according to the present invention, the sensitizing solution is uniformly coated on the transfer roller in place of using the coating nozzle directly, and continuously transferred and coated on the running iron sheet under a predetermined tension. Thus, the solution can be uniformly coated throughout the whole length of the iron sheet without involving any defect. It is also possible to freely determine the thickness with which the solution is coated on each surface of the iron sheet.

Additional advantages and modifications will readily occur to those skilled in the art. Therefore, the invention in its broader aspects is not limited to the specific details, and representative devices, and illustrated examples shown and described herein. Accordingly, various modifications may be made without departing from the spirit or scope of the general inventive concept as defined by the appended claims and their equivalents.

What is claimed is:

1. A method of coating a sensitizing solution on an elongated running length of metal having first and second surfaces, for use in the manufacture of shadow masks for color cathode ray tubes, said method comprising the steps of:

running the metal past first and second tension rollers under tension in a longitudinal direction of the running length of metal while the second surface of the running length of metal is in contact with the circumferential surface of the second tension roller;

bringing a circumferential surface of a transfer roller, which is provided between the first and second tension rollers, into contact with the first surface of the running length of metal, and rotating the transfer roller in a direction opposite to that in which the metal is run;

coating the sensitizing solution on the circumferential surface of the transfer roller by means a coating nozzle which faces the transfer roller and is separated therefrom by a gap; and continuously transferring the coated sensitizing solution from the transfer roller onto the first surface of the running length of metal.

2. A method according to claim 1, which further comprises the steps of:

running the metal past third and fourth tension rollers under the tension in a longitudinal direction of the running length of metal while the first surface of the metal is in contact wit the circumferential surface of the fourth tension roller;

bringing a circumferential surface of a second transfer roller, which is provided between the third and fourth tension rollers, into contact with the second surface of the running length of metal, and rotating the second transfer roller in a direction opposite to that in which the metal is run;

coating the sensitizing solution on the circumferential surface of the second transfer roller by means of a second coating nozzle which faces the transfer roller and is separated therefrom by a gap; and continuously transferring the coated sensitizing solution from the second transfer roller onto the second surface of the metal.

3. An apparatus for coating a sensitizing solution on an elongated running length of metal having first and second surfaces, for use in the manufacture of shadow masks for color cathode ray tubes, said apparatus comprising:

first and second tension rollers provided in a spaced-apart relation;

a transfer roller arranged between the first and second tension rollers;

means for running the length of metal past the first tension roller, the transfer roller and the second tension roller under tension in a longitudinal direction of the running length of metal while the metal is wound around the first and second tension rollers, the transfer roller being in rolling contact with the first surface of the metal, and the second surface of the metal being in contact with a circumferential surface of the second tension roller;

a coating nozzle facing the transfer roller and being separated therefrom by a gap, for coating the sensitizing solution on a circumferential surface of the transfer roller; and means for rotating the transfer roller in a direction opposite to that in which the length of metal is run, so as to continuously transfer the coated sensitizing solution from the transfer roller to the first surface of the metal.

4. An apparatus according to claim 3, wherein said transfer roller has a rotational shaft extending in a direction parallel with the surfaces of the running metal plate and perpendicular to the direction in which the metal plate is run.

5. An apparatus according to claim 4, wherein said transfer roller is made longer than the width of the metal plate and has a pair of end portions projecting beyond side edges of the metal plate.

6. An apparatus according to claim 3, further comprising means for adjusting the gap between the coating nozzle and the transfer roller.

7. An apparatus according to claim 3, further comprising:

third and fourth tension rollers provided in a spaced-apart relation;

a second transfer roller arranged between the third and fourth tension rollers;

means for running the length of metal past the third tension roller, the second transfer roller and the fourth tension roller under a tension in a longitudinal direction of the length of metal while the metal is wound around the third and fourth tension rollers, the second transfer roller being in rolling contact with the second surface of the metal, and the first surface of the metal being in contact with a circumferential surface of the fourth tension roller;

a second coating nozzle facing the second transfer roller and separated therefrom by a gap, for coating the sensitizing solution on a circumferential surface of the transfer roller; and means for rotating the second transfer roller in a direction opposite to that in which the length of metal is run, so as to continuously transfer the coated sensitizing solution from the second transfer roller to the second surface of the metal.

* * * * *